United States Patent
Nagesh et al.

(10) Patent No.: US 12,204,834 B2
(45) Date of Patent: Jan. 21, 2025

(54) DEBUGGING ARCHITECTURE FOR SYSTEM IN PACKAGE COMPOSED OF MULTIPLE SEMICONDUCTOR CHIPS

(71) Applicant: Intel Corporation, Santa Clara, CA (US)

(72) Inventors: Shanker Raman Nagesh, Bangalore (IN); Ashok Jagannathan, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 794 days.

(21) Appl. No.: 17/132,891

(22) Filed: Dec. 23, 2020

(65) Prior Publication Data

US 2022/0198110 A1     Jun. 23, 2022

(51) Int. Cl.
    *G06F 30/33*     (2020.01)
(52) U.S. Cl.
    CPC .................... *G06F 30/33* (2020.01)
(58) Field of Classification Search
    USPC .......................... 716/101, 104, 106, 107, 108
    See application file for complete search history.

(56) References Cited

U.S. PATENT DOCUMENTS

| | | | |
|---|---|---|---|
| 9,123,389 B1 * | 9/2015 | Park | G11C 11/406 |
| 2009/0006894 A1 | 1/2009 | Bellofatto et al. | |
| 2010/0299668 A1 | 11/2010 | Venkumahanti et al. | |
| 2012/0007624 A1 * | 1/2012 | Byeon | G11C 11/4076 |
| | | | 324/750.15 |
| 2014/0047262 A1 * | 2/2014 | Nixon | G06F 1/14 |
| | | | 713/400 |
| 2016/0047859 A1 | 2/2016 | Deutsch et al. | |
| 2018/0285233 A1 | 10/2018 | Norrie et al. | |
| 2019/0214365 A1 * | 7/2019 | Gu | G02F 1/011 |
| 2019/0303268 A1 | 10/2019 | Ansari et al. | |
| 2020/0034318 A1 * | 1/2020 | Nam | G06F 12/0862 |

OTHER PUBLICATIONS

Extended European Search Report for Patent Application No. 21200407.1, Mailed Mar. 16, 2022, 11 pages.

* cited by examiner

*Primary Examiner* — Brian Ngo
(74) *Attorney, Agent, or Firm* — Compass IP Law PC

(57) ABSTRACT

A method is described. The method includes maintaining a synchronized count value in each of a plurality of logic chips within a same package. The method includes comparing the count value against a same looked for count value in each of the plurality of logic chips. The method includes each of the plurality of logic chips recording in its respective local memory at least some of its state information in response to each of the plurality of logic chips recognizing within a same cycle that the count value has reached the same looked for count value.

20 Claims, 8 Drawing Sheets

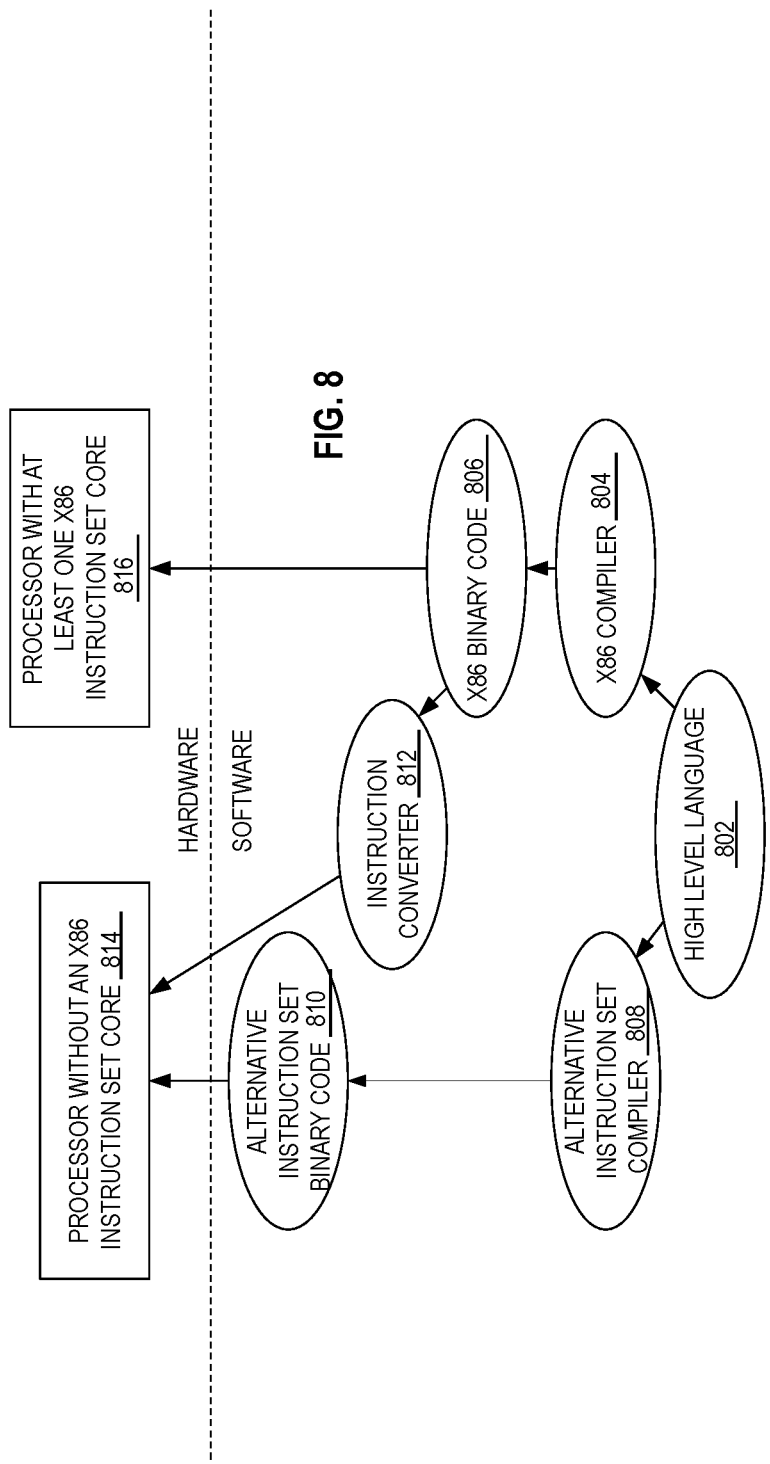

DEBUGGING ARCHITECTURE FOR SYSTEM IN PACKAGE COMPOSED OF MULTIPLE SEMICONDUCTOR CHIPS

FIELD OF INVENTION

The field of invention pertains generally to the computing sciences, and, more specifically, to a debugging architecture for system in package composed of multiple semiconductor chips.

BACKGROUND

Computer systems designers are increasingly seeking ways to pack large amounts of functionality into a single package. One approach seeks to build an entire system composed of multiple semiconductor chips within a single semiconductor chip package. A challenge that arises when adopting such an approach is the difficulty associated with debugging the system within the package.

BRIEF DESCRIPTION OF THE DRAWINGS

The present invention is illustrated by way of example and not limitation in the figures of the accompanying drawings, in which like references indicate similar elements and in which:

FIG. 8 is a block diagram contrasting the use of a software instruction converter to convert binary instructions in a source instruction set to binary instructions in a target instruction set according to some embodiments.

DETAILED DESCRIPTION

Figure 1:
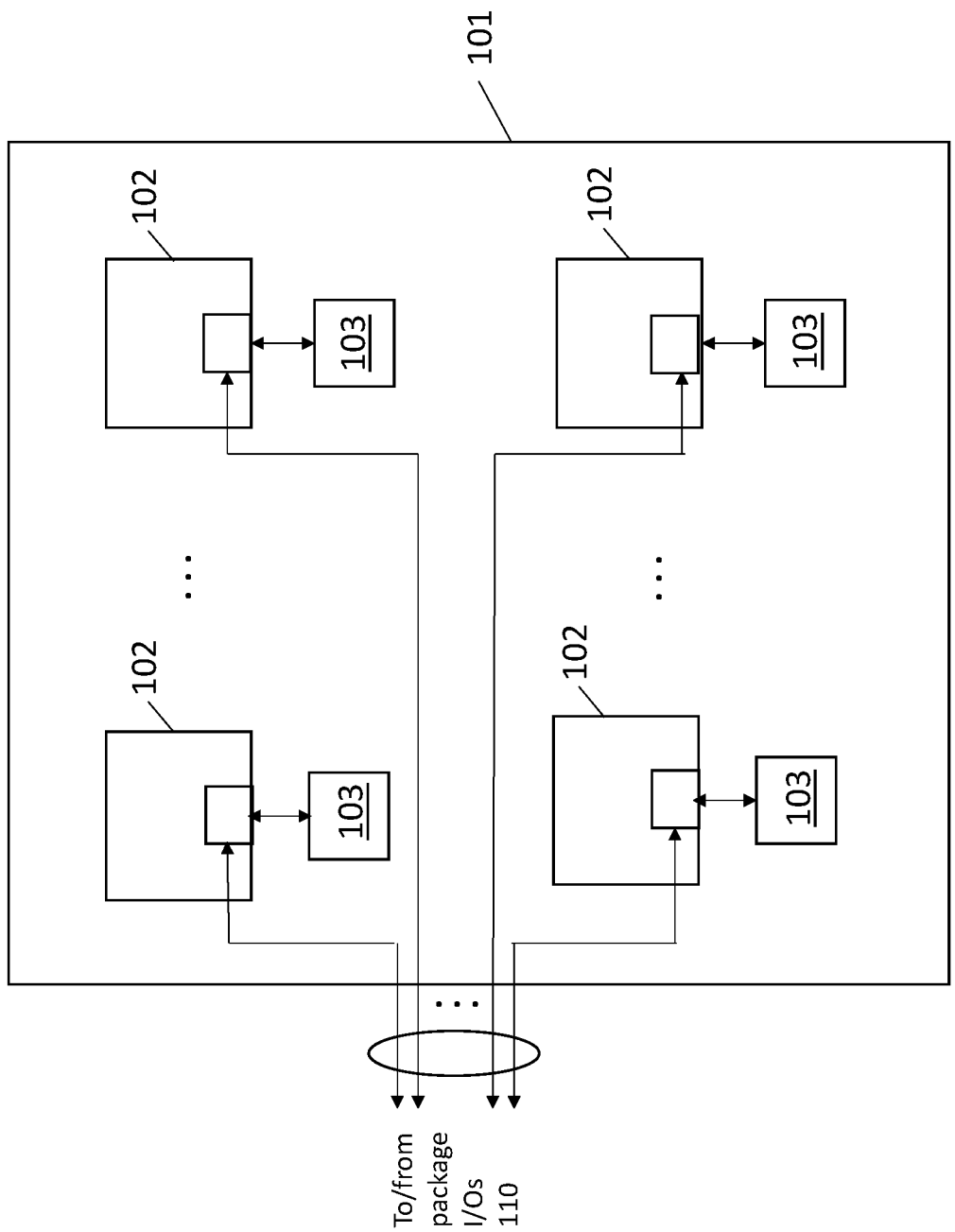
FIG. 1 shows a system comprised of multiple semiconductor chips within a single package.

Semiconductor chips are complex arrangements of logic circuitry that simultaneously perform large numbers of inter-dependent and complex operations (e.g., computational, information steering, etc.). In order to verify that a semiconductor chip is operating as it was designed to operate, the logic designers of a semiconductor chip infuse the chip with "tracing" circuits that monitor and record the chip's operation in real time. With such tracing circuits, engineers are able to both verify actual operation of the chip and debug the chip if it is operating incorrectly.

At a high level, the design of a semiconductor chip can be viewed as a combination of logic and state elements. The logic elements (e.g., as implemented with custom designed logic circuitry) perform complex operations on information. By contrast, the state elements (e.g., registers, scratch-pad memories, caches, etc.) hold both the input information that is processed by the logic elements, and, the output information that is generated by the logic elements in response to the input information. Often, the output information that a state element receives from a preceding logic element becomes input information that the state element provides to a following logic element.

Thus, the design of a semiconductor chip can be viewed as a complex network of interconnected logical elements where state elements are positioned along the connections between logic elements. Over the run-time of a semiconductor chip, the state elements continually receive and forward information, which, in turn, corresponds to the flow of processed information through the semiconductor chip.

Tracing circuits aim to capture this flow by recording the contents of the state elements at critical moments in time over the course of the chip's operation. Here, for instance, a global counter that is built into the semiconductor chip increments with each tick of the chip's master clock. The tracing circuitry is programmed (e.g., by a debug engineer) to record the information (the "state") of specific state elements at specific clock cycles of the chip.

During run-time, when the clock cycle arrives where certain state elements are to have their information recorded, the information in the state elements is dumped or otherwise written to memory. As such, the state information of the chip at critical nodal points within the chip at certain critical moments of time is thereby recorded and preserved. A debug engineer can later access and analyze the recorded information to recreate or otherwise study the chip's actual execution and verify whether or not the chip operated as it was expected to.

Various computing system processing power products are implemented as multiple semiconductor chips within a single package. Here, the packaged product is sold as a single device whose functional characteristics and I/Os are defined at the package level. Inside the package, however, there are multiple semiconductor chips that are operating in coordination with one another to effect the overall functionality of the package as a whole.

A challenge exists, however, with respect to tracing in the case of a multi-chip package solution. A multi-chip package solution is a solution that packs more than one semiconductor chip into a single semiconductor chip package. Since the collection of chips within the package are designed to operate as components within a larger system, the tracing needs to support the larger system as a whole, and not just the chips individually as separate components.

FIG. 1 shows a high level view of a system having multiple semiconductor chips 102 in a single package 101. The chips 102 are interconnected within the package 101 (not depicted in FIG. 2 for illustrative ease) or are otherwise coordinated to effect a "system" within the package 101. Importantly, the chips 102 have been designed to implement a distributed but coordinated tracing infrastructure that supports tracing of operational flows across the chips 102 so that tracing of the overall "system" implemented within the package 101 can be achieved.

As observed in FIG. 1, the package-level system includes multiple "logic" chips 102 and multiple memory chips 103. In the particular package-level system of FIG. 1, each logic chip 102 is assumed to have its own set of one or more "local" memory chips 103. Each of the logic chips 102 contain unique functionality that is designed to perform one or more pertinent functions of the overall system that is implemented within the package 101. By contrast, the local memory chips 103 store information that is used and/or generated by its associated logic chip 102. In various approaches, the local memory 103 is implemented as stacked memory (e.g., memory chips that are stacked on their corresponding logic chip, such as a High Bandwidth Memory (HBM) stacked memory solutions as described in applicable specifications published by the Joint Electron Device Engineering Council (JEDEC) or elsewhere).

Here, many different systems can be implemented in a package 101 according to the high level architecture of FIG. 1. For instance, a high performance graphics processing or neural network array can be realized if each logic chip 102 corresponds to a graphics processor (or neural network processor) and each local memory 103 corresponds to the memory that a graphics processor (or neural network processor) uses to store both instructions and data.

As another example, a high performance processing array can be realized if each logic chip 102 corresponds to a general purpose processor and each local memory 103 corresponds to the memory that a general purpose processor uses to store both instructions and data. As yet another example, a high performance "system-in-package" can be realized if different ones of the logic chips 102 correspond to different functional components of a computer system (e.g., one or more general purpose processor logic chips, one or more graphics processing logic chips, one or more peripheral control logic chips, one or more accelerator logic chips, etc.).

Figure 2:
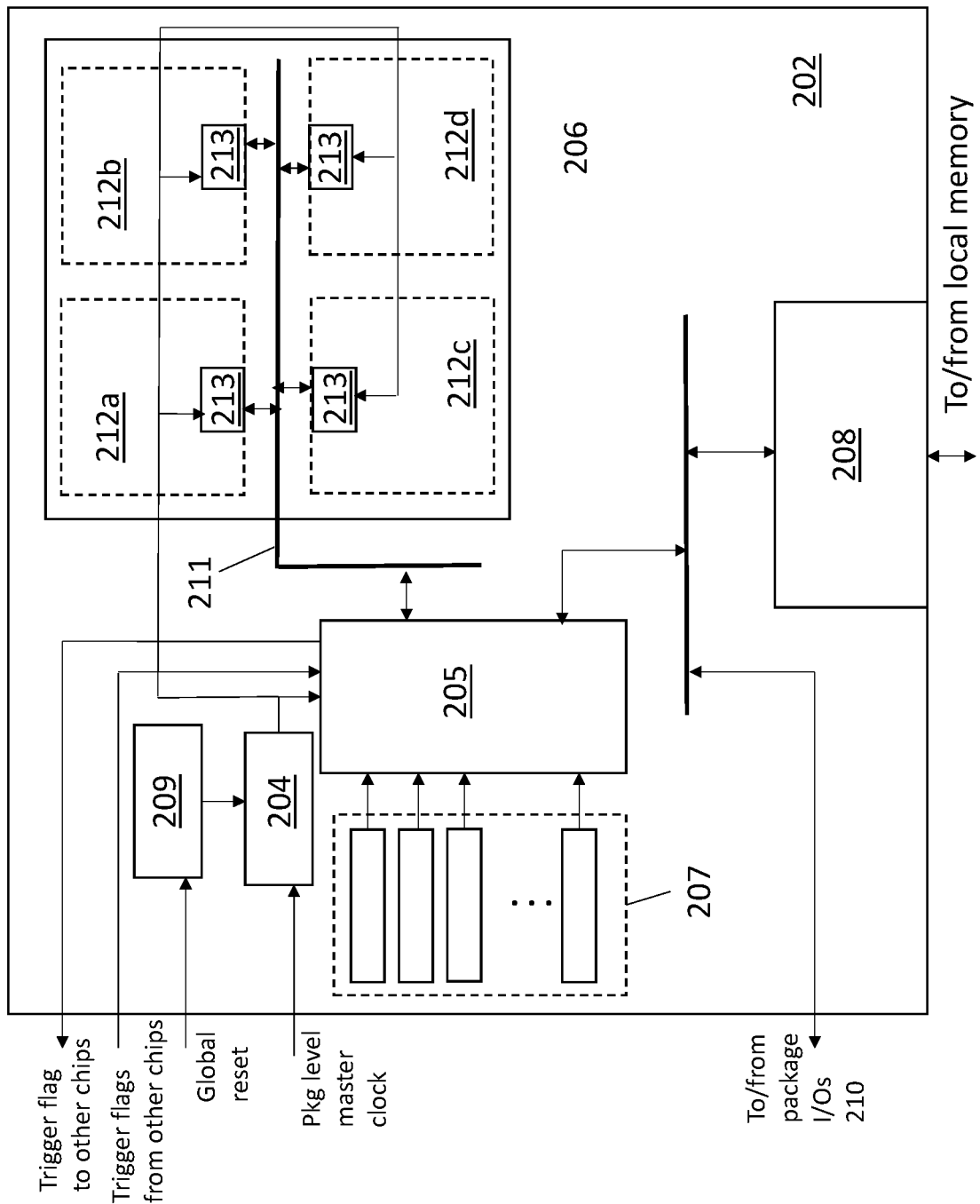
FIG. 2 shows a semiconductor chip having tracing circuitry.

FIG. 2 shows a detailed view 202 of each of the logic chips 102 of FIG. 1. Importantly, as described in more detail further below, each logic chip 202 includes its own dedicated tracing counter 204, where, the collection of counters across all of the logic chips 102 are designed to count in synchronization with one other (all counters across all logic chips simultaneously hold the same count value from, e.g., the same package-level master clock). Additionally, the local memory 103 of each logic chip 102 keeps the tracing information generated by that logic chip.

Here, the use of synchronized counters across the logic chips 102 allows tracing to be defined and implemented within the package 101 as a cohesive whole. That is, if all logic chips 102 maintain a same counter value from a same package level master clock, a particular cycle across all logic chips 102 can be precisely defined across the sequence of cycles that transpire over an extended run time of the package-level system.

As such, coordinating a package-level trace only requires defining which specific state elements of which specific logic chips need to be recorded for a particular counter value (which, again, all chips equally maintain). That is, in order to effect a package-level trace, each logic chip in the package is assigned its own "schedule" of which of its state elements are to have its information recorded for which specific counter values. Notably, which state elements are to be recorded can be uniquely defined for any counter value so that the state information to be recorded can be customized on a cycle by cycle basis (e.g., different subsets of state elements can be defined across different cycles thereby avoiding mass dumps of unnecessary information).

With each logic chip simultaneously maintaining the same counter value across an extended run-time, simultaneously existing state information that exists across two or more different logic chips 202 that needs to be recorded together in order to provide meaningful insight into the operation of the package-level system as a whole (what information existed across multiple chips at the same time), is readily recorded and preserved.

As such, for each logic chip 102, upon the chip's counter reaching a value that the chip's schedule indicates state information is to be recorded, the chip's own dedicated tracing circuitry will record the information of the state elements whose information is to be recorded for that count value. With each chip 102 recording the information it is supposed to for the count value and marking the information with the count value (effectively time stamping the state information), the state of the entire system within the package 101 can be easily reconstructed by combining all state information recorded for all logic chips for the counter value. The scenario repeats itself for all count values that one or more of the logic chips 102 are to record tracing information for.

The recording of the tracing data to the local memory 103 of each logic chip 102 simplifies the physical recording of the tracing information so that it does not need to be transported to/from different logic chips within the package 101 in order to be stored. That is, for each logic chip 102, the storing of the chip's tracing information is reserved to the relatively straightforward task of reading the state information from the chip's state elements when appropriate and writing the information to the chip's local memory 103. Again, each group of data that is collected for a particular counter value should be stamped with the count value so that it can be correctly correlated to the precise time (system master clock cycle) that the data was sampled.

As mentioned above, FIG. 2 shows a more detailed embodiment of a logic chip that has been designed to support tracing as described above. As observed in FIG. 2, the logic chip 202 includes a counter 204, tracing aggregation and control circuitry 205, core logic 206, source registers 207, a local memory interface 208 and tracing bus 211 to transport tracing information and respective interfaces 213 to the bus for each of different partitions 212a,b,c,d within the core logic 206.

The core logic 206 corresponds to the primary functionality of the chip 202. For example, if the logic chip 202 is a graphics processor, the core logic 206 corresponds to the logic circuitry that implements graphics processing, by contrast, if the logic chip 202 is a general purpose multi-processor, the core logic 206 corresponds to a general purpose multi-processor.

The sources 207 of the trace information correspond to the chip's state elements (e.g., registers). The state elements can accept input information (e.g., from off-chip) to be presented to the core logic 206, accept output information that is generated by the core logic 206, and/or, be internal registers within the core logic (for simplicity FIG. 2 does not show state element trace sources that are internal to the core logic 206). In an alternate arrangement, the trace sources 207 are local registers for the tracing function that are coupled to and store the information of the state elements that accept the core logic's input information, accept the core logic's output information and/or the core logic's internal information. For ease of discussion the remainder of the discussion assumes the former approach.

Tracing aggregation and control circuitry 205 receives the chip's tracing schedule, e.g., from local memory, and processes it to comprehend which trace sources are to have their information stored for which specific counter values.

As observed in FIG. 2, the core logic 206 can be viewed as being divided into multiple partitions 212a,b,c,d. Each partition has bus interface logic 213 that is coupled to a bus 211. The bus 211 is also coupled to the aggregation and control circuitry 205. Tracing information collected from one or more state elements within a particular partition are emitted from that partition's interface 213, presented on the bus 211 and received by the aggregation and control circuitry 205.

Logic circuitry associated with each partition's tracing capability is also coupled to counter 204. Here, the aforementioned tracing schedule for the chip 202 can be broken down into different respective schedules for each of the partitions 212*a,b,c,d*. In an embodiment, the tracing aggregation and control circuitry 205 sends each partition its portion of the chip's tracing schedule (e.g., via bus 211). Logic circuitry within each partition then processes the schedule to understand which state elements within the partition are to have their content recorded, and when.

When the count value from the counter 204 equals a value listed in the tracing definition for a particular partition, the partition reads the content from those of its state elements whose information is to be recorded for that count value, stamps the information with the count value and forwards the stamped state information via interface 213 onto bus 211. In various embodiments, each packet or frame sent from a partition to the tracing aggregation and control circuitry 205 not only includes the stamped state information but also identifies which state element(s) sourced the information and identifies the partition that is sending the information.

The aggregation and control circuitry 205 then aggregates the tracing information from each of the partitions 212*a,b,c,d* and causes it to be stored in the local memory. The information can be structured to include, for each state element whose information is being recorded, an identifier of the state element (e.g., register identifier and partition identifier), the state element's content and the corresponding time/counter stamp.

With respect to the aggregation, if the local memory stores information in units of X bytes, the aggregation and control circuitry packs all of the information for a particular count value into units of X bytes and forwards the units of X bytes to the chip's local memory controller for storage in the local memory. If tracing information for more than one count value is packed into a single unit of X bytes, meta data can be added so that the demarcation between the respective data of different count values can be identified.

In an embodiment, in the case of a state element (register) that is located internally within the core logic 206, in various embodiments, a tracing information path is routed directly out of the core logic 206 from the state element (and into the aggregation and control circuitry 205) and into the appropriate interface 210, rather than relying on functional circuitry of the core logic 206 to transport the information to the interface 210. In this manner, the tracing information data path is isolated from the core logic 206. As such, for example, if the core logic 206 becomes "frozen" for any reason, it's state information can be reliably retrieved.

In various embodiments, referring to FIGS. 1 and 2, the count value in each logic chip 102, 202 is guaranteed to be the same value across all of the logic chips because they reset from the same global reset signal. That is, for example, a power good reset signal that is received by the package as a package level input signal is distributed to each of the logic chips 102. Each logic chip has counter reset circuitry 209 that resets the counter value to a preset value (e.g., 0) upon the same reset signal characteristic sequence (e.g., a certain rising/falling edge or sequence of rising/falling edges). As such, the counters of all logic chips 206 are reset to the same reset value during a same cycle.

Additionally, a same master clock signal is routed across the package to each logic chip 102. The counter circuitry 204 of each logic chip 102 increments its respective counter with each cycle of the clock. As such, the counters across all of the logic chips count to the same value on the same clock cycle in lock step with one another.

With respect to obtaining the tracing data, as observed in FIGS. 1 and 2, in an embodiment, each logic chip has a data path from its local memory controller to the package I/Os 110, 210. That is, the data bus of each local memory of each logic chip is routed to external package outputs. As such the tracing data from all of the logic chips 102 can be collected by an external debugging system that connects to the package I/Os and collects the tracing data by reading the tracing data from the local memory. The debugging system then processes the collected tracing data and recreates/studies the state of the entire system within the package 101 on a clock tick by clock tick basis as it existed when the tracing data was recorded during a prior runtime session of the system within the package.

In another mode of operation that is available as an alternative to the above described mode, tracing information is collected directly from the tracing control and aggregator 205. That is, tracing information is routed from the tracing and control aggregator 205 to the external data bus output 210, rather than being dumped into the local memory, and then the package I/Os for reception, e.g., by a logic analyzer.

In various embodiments, in order to conserve package I/Os, the external data bus output 210 from each local memory controller 208 is tied to a same data bus that is connected to the package I/Os. In this case, the contents of only one local memory or logic chip can be presented at the package I/Os at a time. That is, at any one time, the contents of only one local memory or logic chip can be sent out of the package (the data of only one logic chip is given access to the external data bus while the other logic chips are placed in a high impedance state). Alternatively or in combination, buffering may be established within the package for each logic chip so that the logic chips can simultaneously report information, have the information buffered, and then singularly presented at the package I/Os at an appropriate later time.

In various embodiments, the external data bus, whether dedicated for each logic chip or shared amongst logic chips can also be routed to the aggregation and control circuitry 205 so that the aggregation and control circuitry 205 can receive debugging configuration information (such as the aforementioned tracing schedule) from a debugging system that is connected to the package at the external package I/Os.

In various embodiments the tracing circuitry of each logic chip is designed to sample the chip's state for a number of clock cycles after a counter value is observed that has been defined in the chip's tracing schedule. Here, the tracing schedule also identifies how many clock cycles after the count value is reached that the aggregation and control circuitry is to record the chip's state. In this case, once the counter value is reached, tracing data will be streamed into the local memory as a steady stream of information collected over the multiple clock cycles.

In other various embodiments, a logic chip's tracing circuitry supports "triggering" the collection of tracing data from an observed package or chip state rather than a specific counter value. In this case the tracing circuitry within each partition of each chip includes comparison circuitry (not shown) that compares the current state of one or more of its state elements (registers) against a pre-determined value that, e.g., is generated by a debug engineer and/or external debug system that is connected to the package.

Here, the pre-determined value(s) may be loaded into one or more registers (not shown) within each partition. The registers are coupled to one set of inputs of the comparators while the state elements whose content the trigger condition is dependent upon is routed to the other set of inputs to the comparators. If the trigger condition appears in the core logic's state, the pair of values from each set of inputs will match thereby causing the comparators to raise a flag that the trigger condition has been observed. In response, the aggregation and control circuitry 205 will cause the logic chip's state to be recorded for one or more following clock cycles. In further embodiments, the aggregation and control circuitry 205 includes configuration register space (e.g., received via the external data bus from a debug engineer/system) to assist in the setup of the looked for state trigger condition.

In order to perform system/package wide triggering, in an embodiment, each aggregation and control circuit 205 of the each core logic chip in the package aggregates the respective outputs from the aforementioned trigger/comparison circuitry and provides a flag signal to indicate to every other chip in the package whether its looked for trigger condition has been observed.

Each aggregation and control circuit 205 of each core logic chip likewise receives the flag signal from every other core logic chip in the package. When the aggregation and control circuitry 205 of each core logic chip recognizes that its flag is raised and the flag from every other chip has also been raised (e.g., for at least one cycle), the aggregation and control circuitry 205 of every core logic chip will recognize that the system wide trigger condition exists and will induce the recording tracing information for one or more cycles (e.g., based on its configuration register information).

Embodiments may also include pins and signals that run from external package I/Os directly to the individual chips so that the chips can be triggered from externally provided trigger signals.

In various embodiments one or more of the local memory chips are non volatile memory chips. Here, emerging non volatile memory technologies (such as Optane™ by Intel Corporation) are making in-roads against traditional volatile random access memory (such as dynamic random access memory (DRAM)) for various applications such as the local memory of any one or more of the logic chips within the package. Such emerging non volatile memory is typically composed of three dimensional arrays of resistive storage cells that are constructed amongst the interconnect wiring levels formed on the semiconductor chip substrate. In other or combined embodiments, at least some of the local memory is composed of DRAM.

Figure 3:
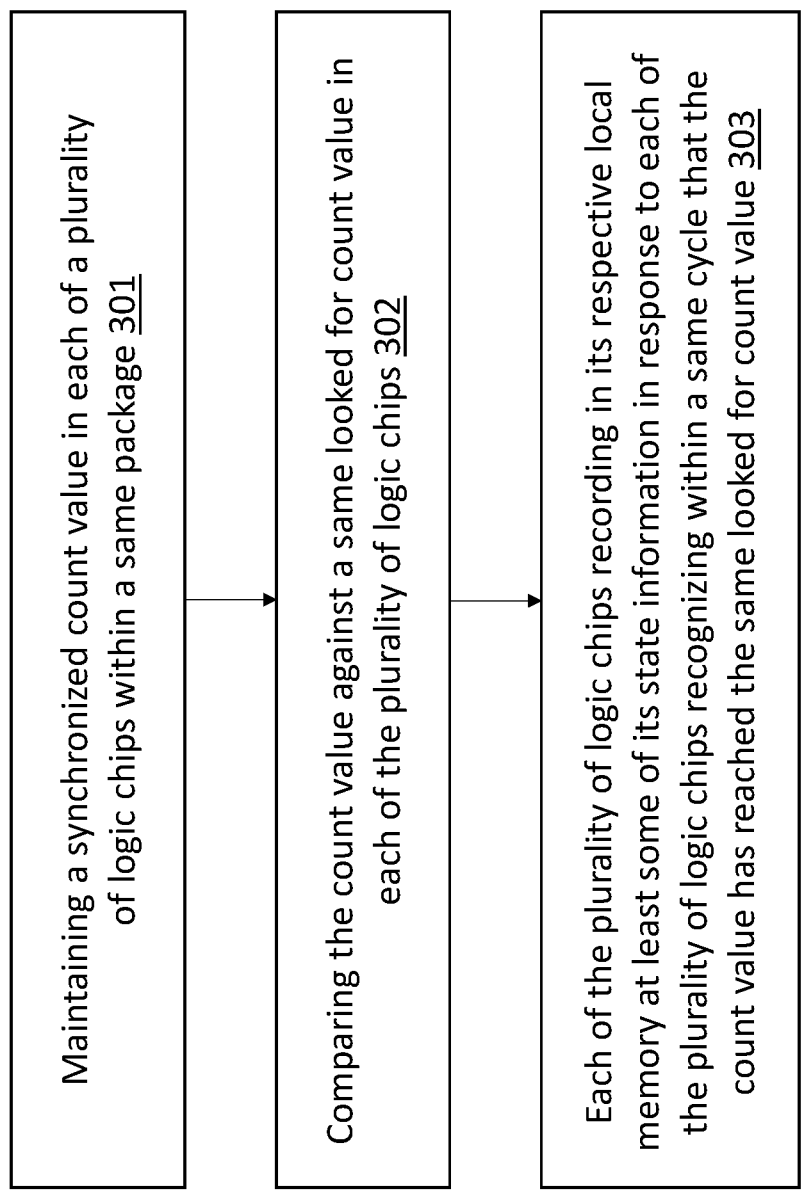
FIG. 3 shows a method for tracing a system comprising multiple semiconductor chips within a single package.

FIG. 3 shows a method described above. As observed in FIG. 3, the method includes maintaining 301 a synchronized count value in each of a plurality of logic chips within a same package. The method also includes comparing 302 the count value against a same looked for count value in each of the plurality of logic chips. The method also includes each of the plurality of logic chips recording 303 in its respective local memory at least some of its state information in response to each of the plurality of logic chips recognizing within a same cycle that the count value has reached the same looked for count value.

Exemplary Computer Architectures

FIGS. 4-8 are block diagrams of exemplary computer architectures. Other system designs and configurations known in the art for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. Any of these computing architectures and/or systems/designs may include multiple semiconductor chips in a single package as described at length above.

Figure 4:
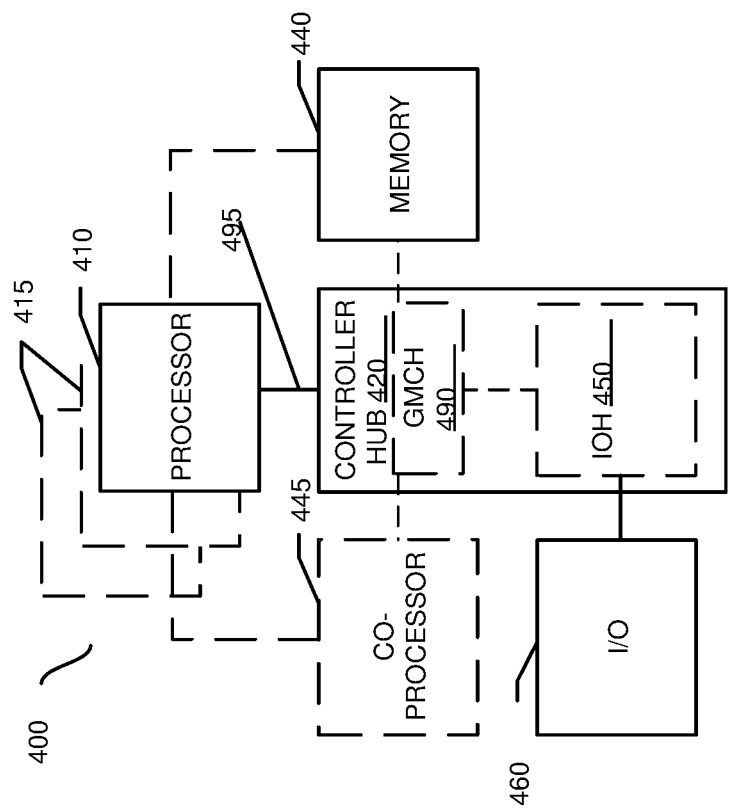
FIG. 4 is a block diagram of an exemplary computer architecture.

Referring now to FIG. 4, shown is a block diagram of a system 400 in accordance with one embodiment of the present invention. The system 400 may include one or more processors 410, 415, which are coupled to a controller hub 420. In one embodiment the controller hub 420 includes a graphics memory controller hub (GMCH) 490 and an Input/Output Hub (IOH) 450 (which may be on separate chips); the GMCH 490 includes memory and graphics controllers to which are coupled memory 440 and a coprocessor 445; the IOH 450 couples input/output (I/O) devices 460 to the GMCH 490. Alternatively, one or both of the memory and graphics controllers are integrated within the processor (as described herein), the memory 440 and the coprocessor 445 are coupled directly to the processor 410, and the controller hub 420 in a single chip with the IOH 450.

The optional nature of additional processors 415 is denoted in FIG. 4 with broken lines. Each processor 410, 415 may include one or more of the processing cores described herein and may be some version of the processor 1200.

The memory 440 may be, for example, dynamic random access memory (DRAM), phase change memory (PCM), or a combination of the two. For at least one embodiment, the controller hub 420 communicates with the processor(s) 410, 415 via a multi-drop bus, such as a frontside bus (FSB), point-to-point interface such as QuickPath Interconnect (QPI), or similar connection 495.

In one embodiment, the coprocessor 445 is a special-purpose processor, such as, for example, a high-throughput MIC processor, a network or communication processor, compression engine, graphics processor, GPGPU, embedded processor, or the like. In one embodiment, controller hub 420 may include an integrated graphics accelerator.

There can be a variety of differences between the physical resources 410, 415 in terms of a spectrum of metrics of merit including architectural, microarchitectural, thermal, power consumption characteristics, and the like.

In one embodiment, the processor 410 executes instructions that control data processing operations of a general type. Embedded within the instructions may be coprocessor instructions. The processor 410 recognizes these coprocessor instructions as being of a type that should be executed by the attached coprocessor 445. Accordingly, the processor 410 issues these coprocessor instructions (or control signals representing coprocessor instructions) on a coprocessor bus or other interconnect, to coprocessor 445. Coprocessor(s) 445 accept and execute the received coprocessor instructions.

Figure 5:
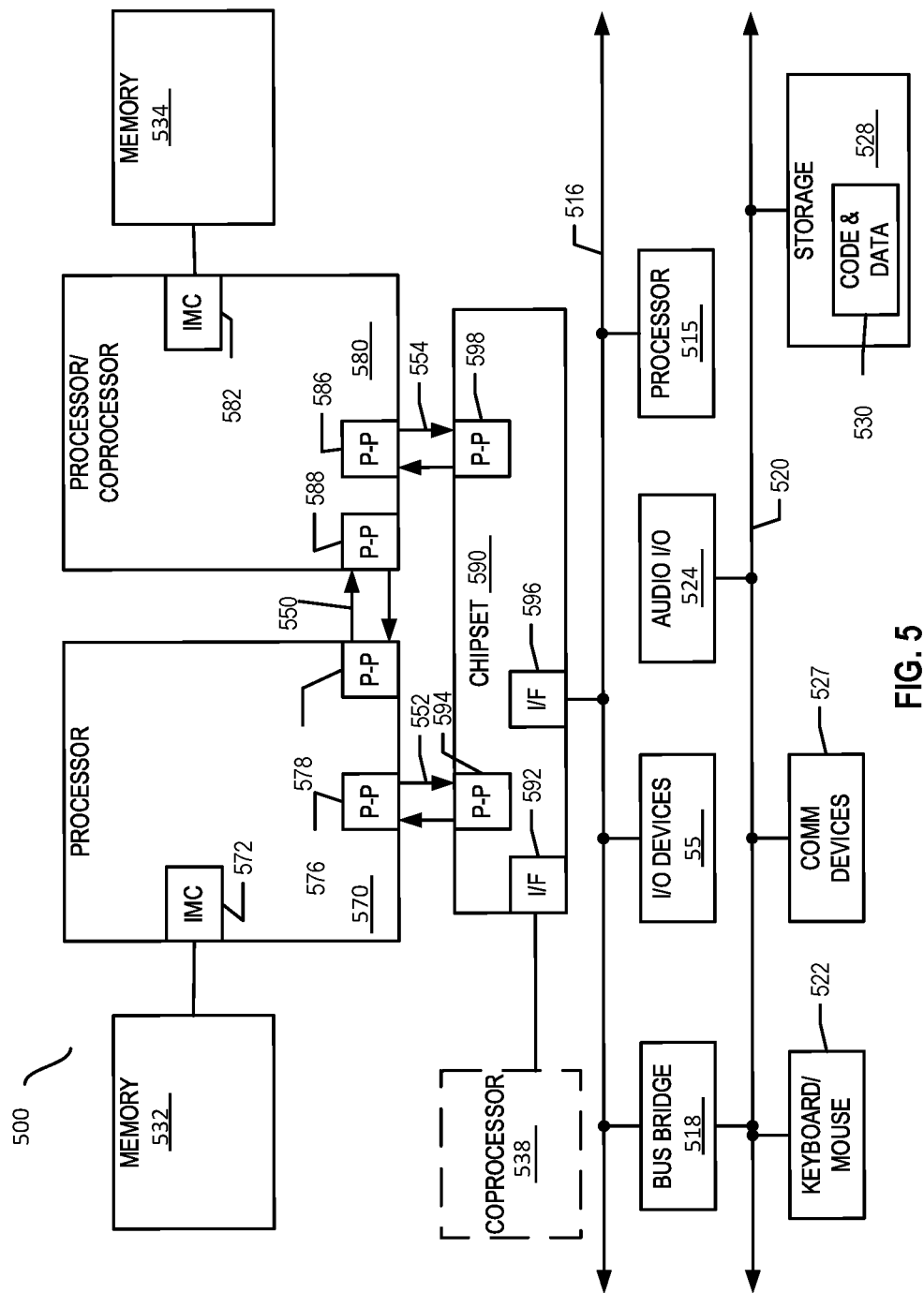
FIG. 5 is a block diagram of a first more specific exemplary system in accordance with some embodiment.

Referring now to FIG. 5, shown is a block diagram of a first more specific exemplary system 500 in accordance with an embodiment of the present invention. As shown in FIG. 5, multiprocessor system 500 is a point-to-point interconnect system, and includes a first processor 570 and a second processor 580 coupled via a point-to-point interconnect 550. In some embodiments, processors 570 and 580 are respectively processors 410 and 415, while coprocessor 538 is coprocessor 445. In another embodiment, processors 570 and 580 are respectively processor 410 coprocessor 445.

Processors 570 and 580 are shown including integrated memory controller (IMC) units 572 and 582, respectively. Processor 570 also includes as part of its bus controller units point-to-point (P-P) interfaces 576 and 578; similarly, second processor 580 includes P-P interface circuits 586 and 588. Processors 570, 580 may exchange information via a point-to-point (P-P) interface 550 using P-P interface circuits 578, 588. As shown in FIG. 5, IMCs 572 and 582 couple the processors to respective memories, namely a memory 532 and a memory 534, which may be portions of main memory locally attached to the respective processors.

Processors 570, 580 may each exchange information with a chipset 590 via individual P-P interfaces 552, 554 using point to point interface circuits 576, 594, 586, 598. Chipset 590 may optionally exchange information with the coprocessor 538 via a high-performance interface 592. In one embodiment, the coprocessor 538 is a special-purpose processor, such as, for example, a high-throughput MIC processor, a network or communication processor, compression engine, graphics processor, GPGPU, embedded processor, or the like.

A shared cache (not shown) may be included in either processor or outside of both processors yet connected with the processors via P-P interconnect, such that either or both processors' local cache information may be stored in the shared cache if a processor is placed into a low power mode.

Chipset 590 may be coupled to a first bus 516 via an interface 596. In one embodiment, first bus 516 may be a Peripheral Component Interconnect (PCI) bus, or a bus such as a PCI Express bus or another third generation I/O interconnect bus, although the scope of the present invention is not so limited.

As shown in FIG. 5, various I/O devices 514 may be coupled to first bus 516, along with a bus bridge 518 which couples first bus 516 to a second bus 520. In one embodiment, one or more additional processor(s) 515, such as coprocessors, high-throughput MIC processors, GPGPU's, accelerators (such as, e.g., graphics accelerators or digital signal processing (DSP) units), field programmable gate arrays, or any other processor, are coupled to first bus 516. In one embodiment, second bus 520 may be a low pin count (LPC) bus. Various devices may be coupled to a second bus 520 including, for example, a keyboard and/or mouse 522, communication devices 527 and a storage unit 528 such as a disk drive or other mass storage device which may include instructions/code and data 530, in one embodiment. Further, an audio I/O 524 may be coupled to the second bus 520. Note that other architectures are possible. For example, instead of the point-to-point architecture of FIG. 5, a system may implement a multi-drop bus or other such architecture.

Figure 6:
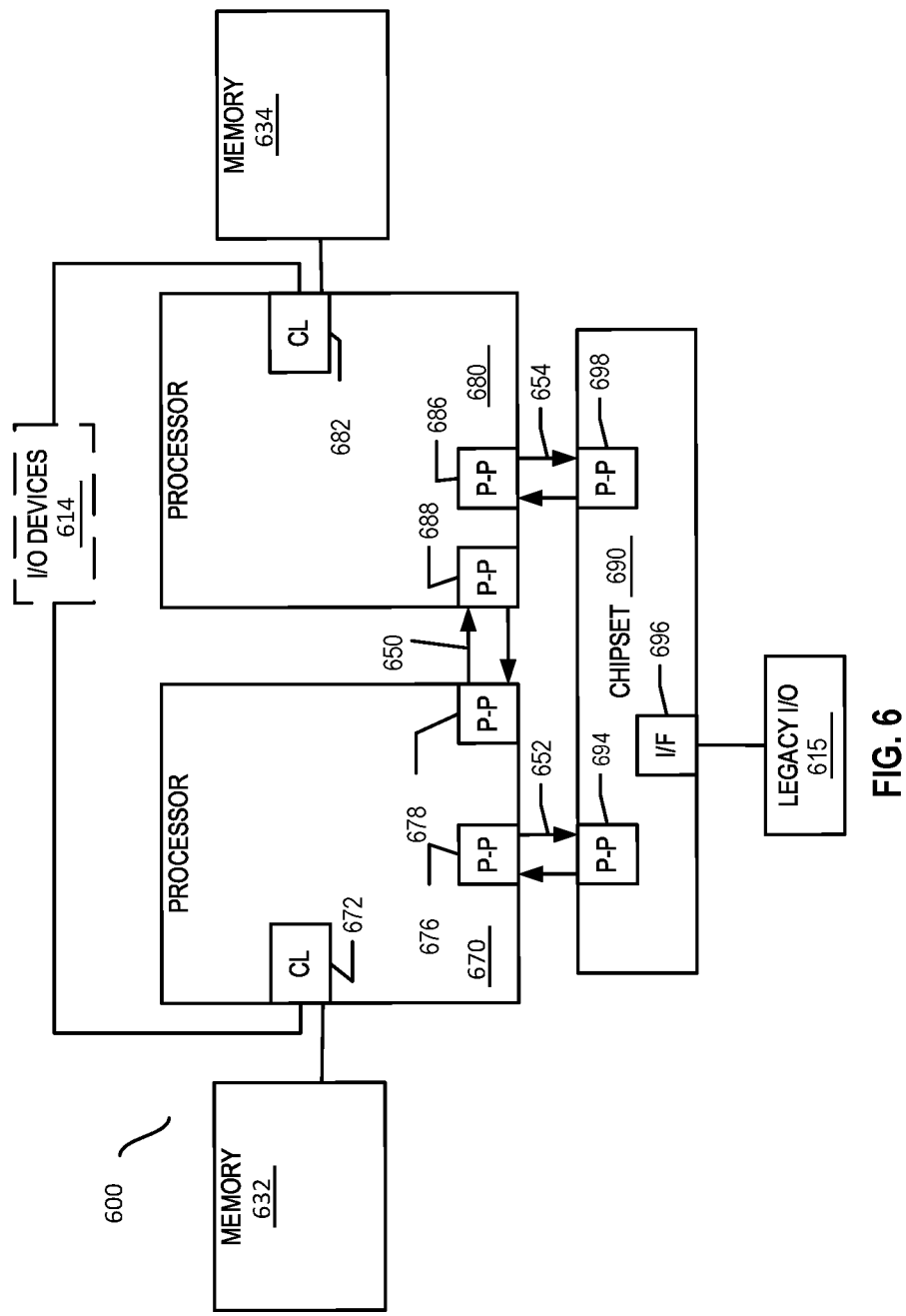
FIG. 6 is a block diagram of a second more specific exemplary system in accordance with some embodiments.

Referring now to FIG. 6, shown is a block diagram of a second more specific exemplary system 600 in accordance with an embodiment of the present invention. Like elements in FIGS. 5 and 6 bear like reference numerals, and certain aspects of FIG. 5 have been omitted from FIG. 6 in order to avoid obscuring other aspects of FIG. 6.

FIG. 6 illustrates that the processors 570, 580 may include integrated memory and I/O control logic ("CL") 672 and 682, respectively. Thus, the CL 672, 682 include integrated memory controller units and include I/O control logic. FIG. 6 illustrates that not only are the memories 532, 534 coupled to the CL 672, 682, but also that I/O devices 614 are also coupled to the control logic 672, 682. Legacy I/O devices 615 are coupled to the chipset 590.

Figure 7:
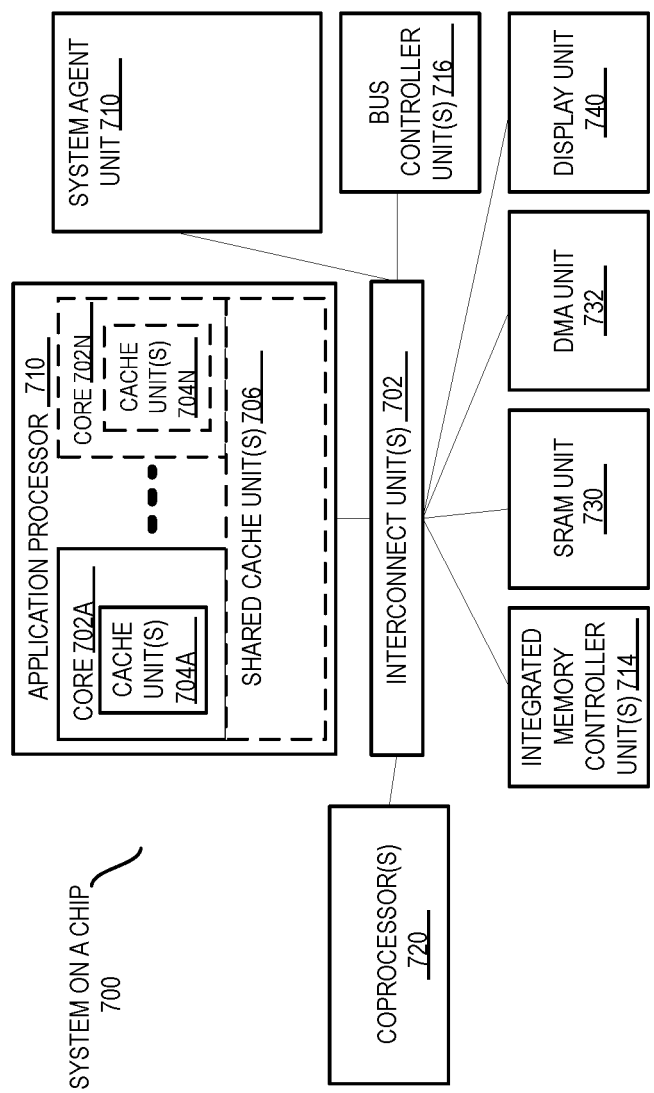
FIG. 7 is a block diagram of a System-on-a-Chip (SoC) in accordance with some embodiments.

Referring now to FIG. 7, shown is a block diagram of a SoC 700 in accordance with an embodiment of the present invention. Similar elements in FIG. 12 bear like reference numerals. Also, dashed lined boxes are optional features on more advanced SoCs. In FIG. 7, an interconnect unit(s) 702 is coupled to: an application processor 710 which includes a set of one or more cores 702A-N, which include cache units 704A through 704N, and shared cache unit(s) 706; a system agent unit 710; a bus controller unit(s) 716; an integrated memory controller unit(s) 714; a set of one or more coprocessors 720 which may include integrated graphics logic, an image processor, an audio processor, and a video processor; an static random access memory (SRAM) unit 730; a direct memory access (DMA) unit 732; and a display unit 740 for coupling to one or more external displays. In one embodiment, the coprocessor(s) 720 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 530 illustrated in FIG. 5, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMS) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products. Emulation (including binary translation, code morphing, etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

FIG. 8 is a block diagram contrasting the use of a software instruction converter to convert binary instructions in a source instruction set to binary instructions in a target instruction set according to some embodiments of the invention. In the illustrated embodiment, the instruction converter is a software instruction converter, although alternatively the instruction converter may be implemented in software, firmware, hardware, or various combinations thereof. FIG. 8 shows a program in a high level language 802 may be compiled using an x86 compiler 804 to generate x86 binary code 806 that may be natively executed by a processor with at least one x86 instruction set core 816. The processor with at least one x86 instruction set core 816 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 804 represents a compiler that is operable to generate x86 binary code 806 (e.g., object code) that can, with or without additional linkage processing, be executed on the processor with at least one x86 instruction set core 816. Similarly, FIG. 8 shows the program in the high level language 802 may be compiled using an alternative instruction set compiler 808 to generate alternative instruction set binary code 810 that may be natively executed by a processor without at least one x86 instruction set core 814 (e.g., a processor with cores that execute the MIPS instruction set of MIPS Technologies of Sunnyvale, CA and/or that execute the ARM instruction set of ARM Holdings of Sunnyvale, CA). The instruction converter 812 is used to convert the x86 binary code 806 into code that may be natively executed by the processor without an x86 instruction set core 814. This converted code is not likely to be the same as the alternative instruction set binary code 810 because an instruction converter capable of this is difficult to make; however, the converted code will accomplish the general operation and be made up of instructions from the alternative instruction set. Thus, the instruction converter 812 represents software, firmware, hardware, or a combination thereof that, through emulation, simulation or any other process, allows a processor or other electronic device that does not have an x86 instruction set processor or core to execute the x86 binary code 806.

What is claimed is:

1. An apparatus, comprising:
    multiple logic chips within a same semiconductor chip package, each of the multiple logic chips being coupled to a respective local memory, each of the multiple logic chips comprising counter circuits, each of the counter circuits to maintain synchronized count values over a runtime of the multiple logic chips within the same semiconductor chip package so that a same clock cycle within the semiconductor chip package is identifiable to each of the multiple logic chips, each of the multiple logic chips comprising tracing circuitry to record at least some of its state as it existed during the same clock cycle to its respective local memory.

2. The apparatus of claim 1 wherein the respective local memory is implemented as stacked memory chips.

3. The apparatus of claim 2 wherein the stacked memory chips are stacked on their respective logic chip.

4. The apparatus of claim 1 wherein at least one of the multiple logic chips comprises core logic circuitry to implement any of:
    a graphics processor;
    a neural network processor;
    a general purpose multi-processor.

5. The apparatus of claim 1 wherein a data path exists from each respective local memory to inputs/outputs (I/Os) of the package.

6. The apparatus of claim 1 wherein each of the multiple logic chips comprise circuitry to trigger recording of at least some of their state in response to an observed state within each of the multiple logic chips within the semiconductor chip package.

7. The apparatus of claim 1 wherein state information comprises any of:
    input information applied to core logic of any of the multiple logic chips;
    output information generated by core logic of any of the multiple logic chips;
    state information within core logic of any of the multiple logic chips.

8. A logic chip, comprising;
    core logic;
    an interface to a local memory; and,
    a counter circuit, the counter circuit to maintain synchronized count values over a runtime with other logic chips that are to be within a same package as the logic chip so that a same clock cycle within the package is identifiable to each of the other logic chips and the logic chip;
    tracing circuitry to record into the local memory at least some of the logic chip's state as it existed during the same clock cycle;
    trigger circuitry and inputs from respective trigger circuits of the other logic chips, the trigger circuitry to recognize a looked for state of the logic chip and, from asserted signals on the inputs, that respective looked for states exist of the other logic chips, and, record into the local memory at least some of the logic chip's state in response thereto.

9. The logic chip of claim 8 wherein the local memory is implemented as stacked memory chips.

10. The logic chip of claim 9 wherein the stacked memory chips are to be stacked on the logic chip.

11. The logic chip of claim 8 wherein core logic is to implement any of:
    a graphics processor;
    a neural network processor;
    a general purpose multi-processor.

12. The logic chip of claim 8 wherein a data path exists from the local memory to external I/Os of the logic chip, the data path to extend to inputs/outputs (I/Os) of the package.

13. The logic chip of claim 8 wherein each of the other logic chips comprise circuitry to trigger recording of at least some of their state in response to an observed state within each of the other logic chips within the same package.

14. The logic chip of claim 8 wherein state information comprises any of:
   input information applied to the core logic;
   output information generated by the core logic;
   state information within the core logic.

15. A method, comprising:
   maintaining a synchronized count value in each of a plurality of logic chips within a same package;
   comparing the synchronized count value against a same looked for count value in each of the plurality of logic chips; and,
   each of the plurality of logic chips recording in its respective local memory at least some of its state information in response to each of the plurality of logic chips recognizing within a same clock cycle that the synchronized count value has reached the same looked for count value.

16. The method of claim 15 further wherein the respective local memory is implemented as stacked memory.

17. The method of claim 16 wherein the stacked memory is a High Bandwidth Stacked (HBM) stacked memory defined by a Joint Electron Device Engineering Council (JEDEC) specification.

18. The method of claim 15 wherein at least one of the plurality of logic chips comprises core logic circuitry to implement any of:
   a graphics processor;
   a neural network processor;
   a general purpose multi-processor.

19. The method of claim 15 wherein state information comprises any of:
   input information applied to core logic of any of the plurality of logic chips;
   output information generated by core logic of any of the plurality of logic chips;
   state information within the core logic of any of the plurality of logic chips.

20. The method of claim 15 further comprising triggering recording of state information within each of the plurality of logic chips during the same cycle within the package in response to looked for state information in each of the plurality of logic chips being present in each of the plurality of logic chips, wherein, each of the plurality of logic chips looks for its own looked for state information and communicates its status to each of the other logic chips.

* * * * *